(12) United States Patent
Kaiser et al.

(10) Patent No.: US 6,415,406 B1
(45) Date of Patent: Jul. 2, 2002

(54) INTEGRATED CIRCUIT HAVING A SELF-TEST DEVICE AND METHOD FOR PRODUCING THE INTEGRATED CIRCUIT

(75) Inventors: Robert Kaiser, Kaufering; Hans-Jürgen Krasser, München; Florian Schamberger, Bad Reichenhall, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/368,134

(22) Filed: Aug. 4, 1999

(30) Foreign Application Priority Data

Aug. 4, 1998 (DE) .......................... 198 35 258

(51) Int. Cl.⁷ ............................ G01R 31/28; H04L 1/22
(52) U.S. Cl. ............................ 714/733; 714/30; 714/34
(58) Field of Search ................. 714/730, 733, 714/34, 30, 25

(56) References Cited

U.S. PATENT DOCUMENTS

| | | | | |
|---|---|---|---|---|
| 4,433,413 A | * | 2/1984 | Fasang | 714/732 |
| 5,173,906 A | | 12/1992 | Dreibelbis et al. | |
| 5,210,864 A | * | 5/1993 | Yoshida | 714/37 |
| 5,355,369 A | * | 10/1994 | Greenberger et al. | 714/727 |
| 5,515,382 A | * | 5/1996 | Lassorie | 714/730 |
| 5,689,636 A | * | 11/1997 | Kleber et al. | 714/45 |
| 6,173,395 B1 | * | 1/2001 | Wisor et al. | 712/236 |
| 6,247,146 B1 | * | 6/2001 | Wheatley et al. | 714/38 |

FOREIGN PATENT DOCUMENTS

| | | | |
|---|---|---|---|
| DE | 689 23 828 T2 | 3/1996 | |
| DE | 195 34 155 C1 | 10/1996 | |
| EP | 18736 A | * 11/1980 | .......... G06F/11/26 |

OTHER PUBLICATIONS

'Test and Debug Memory Cards Using a Programmable On–Chip Tester'; Publication–Data: IBM Technical Disclosure Bulletin, Nov. 1996; vol. No.: 39; Issue No.: 11; p. No.: 147–150; Publication–Date: Nov. 1, 1996.*
Curry, R.J.; 'CASS CTS software design' AUTOTESTCON '95. Systems Readiness: Test Technology for the 21st Century. Conference Record, 1995 pp.: 450–455.*

* cited by examiner

Primary Examiner—Albert Decady
Assistant Examiner—Joseph D. Torres
(74) Attorney, Agent, or Firm—Laurence A. Greenberg; Werner H. Stemer; Gregory L. Mayback

(57) ABSTRACT

An integrated circuit incorporating a self-test device and a method for producing a self-testing integrated circuit. The integrated circuit has a program memory with at least one external terminal for loading external test programs. The integrated circuit has a self-test device connected to the program memory, the self-test device executing program commands of a test program loaded into the program memory, the program commands succeeding one another in address terms, for carrying out a self-test of the circuit. The self-test device has an interrupt signal input, through which the self-test device interrupts the test program that is currently being executed by not executing the respective succeeding program command in address terms. Rather, it executes a program jump within the test program, the program jump being triggered by the interrupt signal.

9 Claims, 2 Drawing Sheets

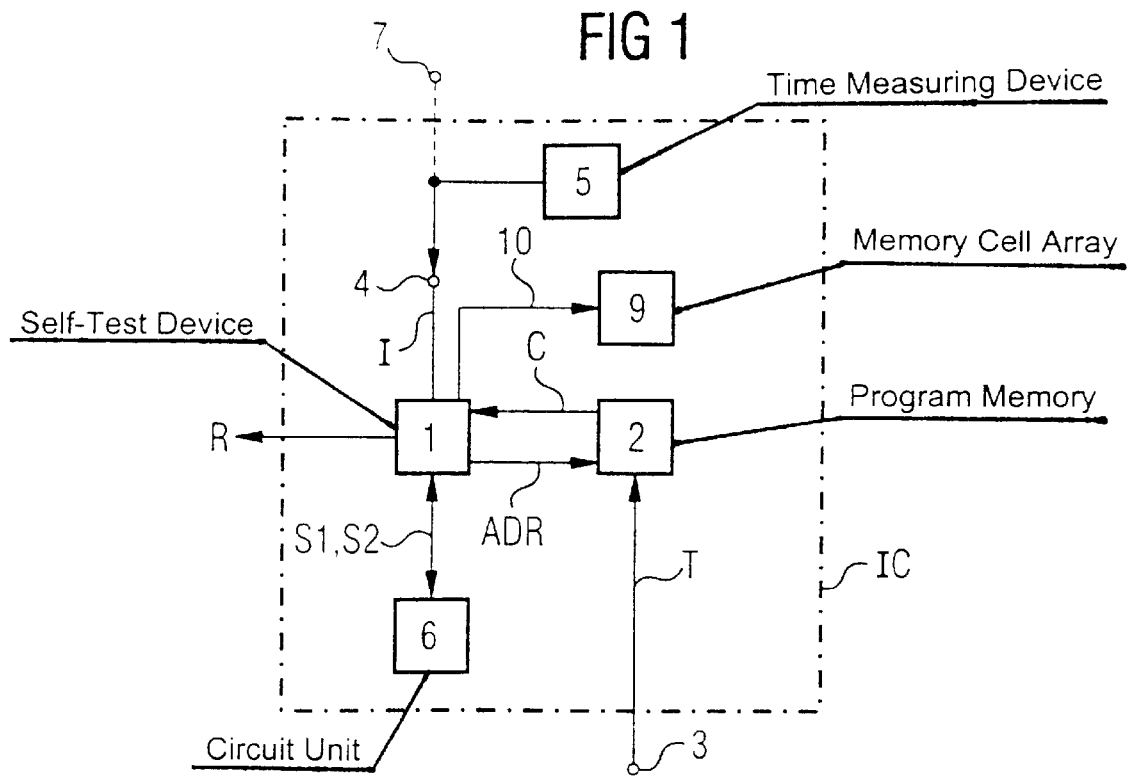
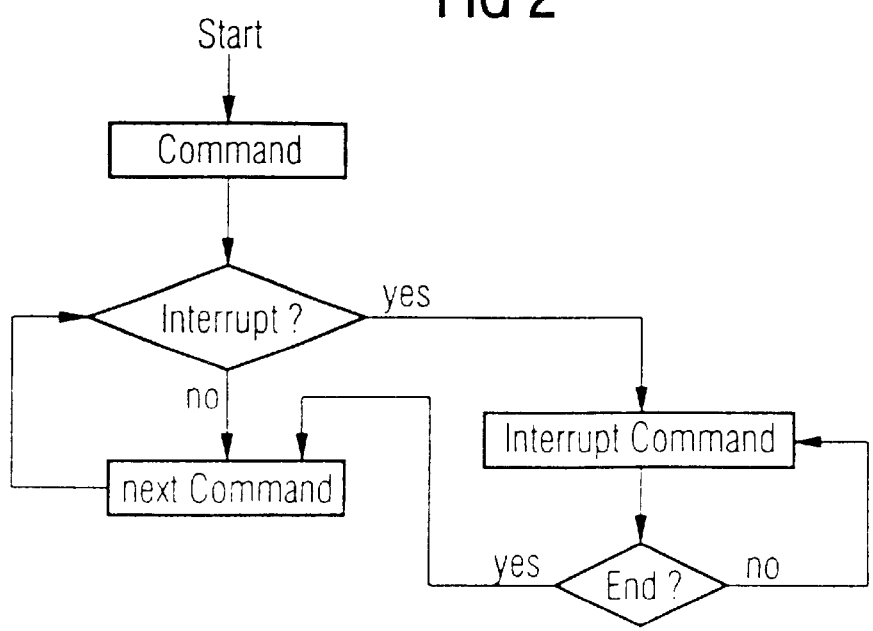

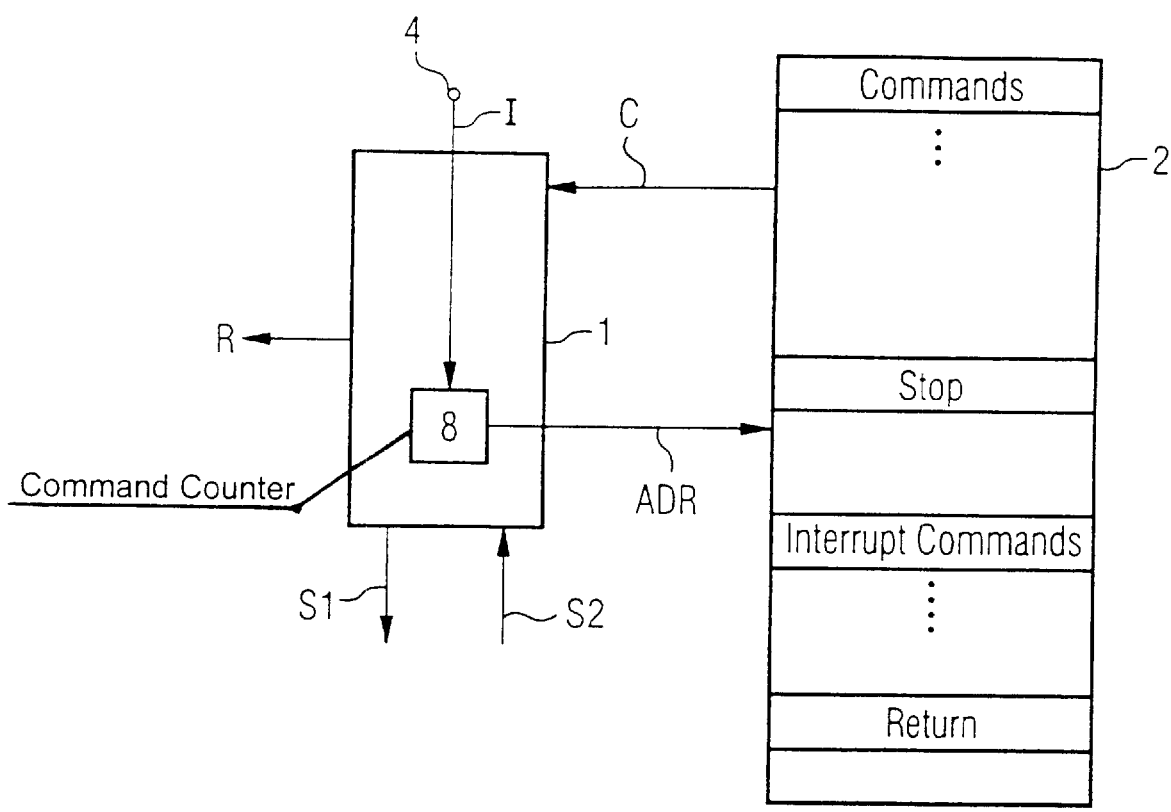

INTEGRATED CIRCUIT HAVING A SELF-TEST DEVICE AND METHOD FOR PRODUCING THE INTEGRATED CIRCUIT

BACKGROUND OF THE INVENTION

Field of the Invention

The invention relates to an integrated circuit having a self-test device and a method for producing the integrated circuit.

U.S. Pat. No. 5,173,906 to Dreibelbis et al. describes an integrated circuit having a self-test device (built-in self-test). In a test-operating mode, the self-test device carries out a test of specific circuit components of the integrated circuit. At the same time, it carries out a desired/actual comparison of signals generated by the circuit unit to be tested. The self-test device records errors during the test. After the test concludes, the self-test device passes one or more result signals to a point outside the integrated circuit, the result signals specifying the extent to which errors have occurred during self-test implementation.

A self-test device may be realized either through wired logic, a programmable logic unit, or a controller, which in each case executes test programs that can be loaded into a program memory of the integrated circuit. In the last of the three mentioned cases, the self-test device processes a test program situated in the program memory command by command, without the ability to influence the program flow.

SUMMARY OF THE INVENTION

It is accordingly an object of the invention to provide an integrated circuit having a self test device and a method for producing a self-testing integrated circuit, which overcomes the hereinafore-mentioned disadvantages of the heretofore-known devices of this general type and which permits an integrated circuit with a self-test device and a program memory to store an externally loadable test program for the self-test device, whereby it is possible to influence the test program flow.

With the foregoing and other objects in view, there is provided, in accordance with the invention, an integrated circuit, including at least one external terminal, a program memory connected to the at least one external terminal for loading external test programs into the program memory, and a self-test device connected to the program memory and having an input for an interrupt signal, the self-test device executing program commands of the external test program loaded into the program memory to carry out a self-test of the integrated circuit, the program commands succeeding one another in address terms, the self-test device, upon receiving the interrupt signal, interrupting an execution of the external test program by executing a program jump in address terms within the external test program instead of executing the respective succeeding program command of the external test program.

The integrated circuit of the invention is distinguished by the fact that its self-test device has an input for an interrupt signal, through which the self-test device interrupts the test program currently being executed by not executing the respective succeeding program command of the test program in address terms. Rather, it executes a program jump within the test program, the program jump being triggered by the interrupt signal.

Providing an interrupt possibility by the self-test device during the execution of a test program advantageously makes it possible to influence the course of the test. The interrupt signal can either be generated on-chip or be fed to the integrated circuit externally. Allowing for program flow influencing, for example, by either an integrated circuit operator or an external test device. Also for example, an integrated circuit operator can trigger the interrupt dependent upon specific operating states and/or specific signals generated on the integrated circuit. The invention is suitable for application in any kind of integrated circuit, for example, in logic or memory circuits.

Memory cells of dynamic memory circuits (DRAMs) are usually realized as single-transistor memory cells. Due to leakage current of their storage capacitor, it is necessary to regularly refresh the stored information. The act is referred to as refresh.

In accordance with a further feature of the invention, the integrated circuit is a dynamic memory circuit having memory cells, in which the interrupt signal triggers a program jump to program commands, upon execution thereof, the self-test device carries out a memory cell content refresh. The development affords the advantage of eliminating the need for providing memory cell refresh through additional devices because the self-test device itself carries out the refresh. Co-ordination between the respective test program to be executed and refresh is temporarily optimized because of the self-test device carrying out the refresh. The result is particularly expedient if the self-test device tests the memory cells in the context of the test program. The memory cells are then both tested and refreshed by the self-test device.

In accordance with an added feature of the invention, there is provided a time measuring device for generating the interrupt signal. The invention can then be dimensioned advantageously so that the interrupt signal is generated at desired, regular time intervals. The configuration makes the invention particularly suitable for generating the interrupt signal for the self-test device to trigger refresh. As is known, refresh is cyclically repeated.

If necessary, the interrupt signal can, inter alia, also be used for prematurely ending the test program currently being processed by the self-test device. In addition, it can be used for interrupting the test program currently being executed, initializing the self-test device and subsequently beginning the processing of the program anew at the program start.

In accordance with an additional feature of the invention, there is provided a second external terminal for supplying the interrupt signal, the interrupt signal originating from outside the integrated circuit.

With the objects of the invention in view, there is also provided a method of producing a self-testing integrated circuit, the method including the steps of providing a self-test device, a program memory and an external terminal, connecting the self-test device to the program memory, connecting the program memory to the external terminal, loading external test programs having programs commands into the program memory through the external terminal, running the external test program and executing the program commands to carry out a self-test of the integrated circuit, the program commands succeeding one another in address terms, generating an interrupt signal and inputting the interrupt signal into the self-test device, interrupting execution of the external test program being executed by the self-test device by executing a program jump in address terms within the external test program instead of executing the respective succeeding program command of the external test program, the program jump being triggered by the interrupt signal.

In accordance with a further mode of the invention, there is provided the step of subsequently executing the respective succeeding program command of the external test program after the program commands for carrying out a self-test of the integrated circuit are complete.

In accordance with an added mode of the invention, there is provided the step of providing a dynamic memory circuit having memory cells, with the step of executing the program commands including triggering a program jump to execute a memory cell refresh through the program commands.

In accordance with an additional mode of the invention, the step of generating the interrupt signal including generating the interrupt signal by a time measuring device.

In accordance with a concomitant mode of the invention, there is provided the steps of providing a further external terminal and feeding the interrupt signal from outside the integrated circuit through the further external terminal.

Other features that are considered as characteristic for the invention are set forth in the appended claims.

Although the invention is illustrated and described herein as embodied in an integrated circuit having a self-test device and a method for producing the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of an embodiment according to the invention;

FIG. 2 is a flow diagram for the diagrammatic embodiment of FIG. 1; and

FIG. 3 is a diagrammatic extract of FIG. 1 showing greater detail of program command.

DESCRIPTION OF THE PREFERRED EMBODIMENTS

Referring now to the figures of the drawings in detail and first, particularly to FIG. 1 thereof, there is seen an integrated circuit IC having a self-test device 1 and a program memory 2 and also a time measuring device 5 and a circuit unit 6 to be tested by the self-test device 1. The program memory 2 serves for storing test programs T that can be fed in from outside the integrated circuit IC through terminals 3. The self-test device 1 is connected to the program memory 2 such that program commands C of the test program T stored in the program memory 2 are communicated from the program memory 2 to the self-test device 1, which then executes them. The self-test device addresses program commands C using addresses ADR. In accordance with the respective program command C to be processed, the self-test device 1 feeds test signals S1 to the circuit unit 6 to be tested and receives output signals S2 from the circuit unit 6 in response to the test signals. Furthermore, the self-test device 1 carries out a desired/actual comparison of the circuit unit 6 output signals S2 with expected values. The self-test device 1 then communicates corresponding result signals R to a point outside the integrated circuit IC. In this embodiment, the self-test device 1 communicates a result signal R to a point outside the integrated circuit IC only after a respective test program T to be processed has concluded. The result signal R specifies whether or not an error has occurred during the execution of the test (fail/no fail signal). In other preferred embodiments, it is also possible for the self-test device 1 to output result signals continuously, even during the test program execution. Moreover, the result signals can include more detailed information other than whether or not a test passes successfully. Such additional information can relate, for example, to the number, type and/or location of the errors that have occurred.

The self-test device 1 in FIG. 1 also has an input 4 for an interrupt signal I. The self-test device 1 interrupts the processing of the test program T stored in the program memory 2 and executes a program jump when the interrupt signal I is activated.

FIG. 2 shows the execution flow after the test program T starts. The self-test device 1 processes the program commands C (Command) one after the other, provided that the interrupt signal I is not received; receipt of an interrupt signal I initiates an interrupt. If, however, an interrupt is initiated, an interrupt program command, reached by a program jump within the test program T to be processed, is executed instead of the next program command. Subsequent interrupt program commands are then executed until the subroutine concludes. A return is then made to the next regular program command.

FIG. 3 shows the self-test device 1 and the program memory 2 from FIG. 1 in greater detail. The self-test device 1 has a command counter 8. The command counter 8 generates the addresses ADR for addressing individual program commands C. The processing of the test program stored in the program memory 2 begins with the program command situated at the lowest address, that is to say, at the beginning of the test program T. The individual program commands, addressed through the command counter 8, are thereupon loaded into the self-test device 1 and executed by the self-test device 1. Unless the interrupt signal I is activated, the test program will run through to the end without interruption. If, on the other hand, an interrupt does occur, the command counter 8 performs readdressing, resulting in a program jump to the interrupt program commands. After the interrupt program commands are processed, a return command causes a return to the main program.

In another preferred embodiment of the invention, the interrupt signal I is fed to the integrated circuit IC through an external terminal 7, permitting external influence of test program execution by the self-test device 1. In this embodiment, the integrated circuit IC includes a time measuring device 5, which supplies or activates the interrupt signal I at regular time intervals. Also in this embodiment, each time an interrupt signal occurs, dynamic memory cells of the integrated circuit IC are refreshed. In other words, the interrupt program commands enable a memory cell refresh triggered by the self-test device 1. The self-test device 1 supplies corresponding control signals 10, which are required for such a refresh, to a memory cell array 9 of the integrated circuit IC. In other preferred embodiments of the invention, the memory cell array 9 may also be part of the circuit unit 6 to be tested, or may correspond to the circuit unit 6 to be tested. In that case, the self-test device 1 serves both for testing the memory cells and for carrying out the memory cell refresh.

Therefore, test program interrupt of the invention makes it possible to provide any desired regular program commands within the test program in any desired order, with memory cell refresh always being insured, provided that the corresponding interrupt subroutine is part of the test program. The invention, therefore, achieves a high degree of flexibility in test program configuration.

We claim:

1. An integrated circuit, comprising:

at least one external terminal;

a program memory connected to said at least one external terminal for loading external test programs into said program memory; and a self-test device connected to said program memory and having an input for an interrupt signal, said self-test device executing program commands of the external test program loaded into said program memory to carry out a self-test of the integrated circuit, the program commands succeeding one another in address terms, said self-test device, upon receiving the interrupt signal, interrupting an execution of the external test program by executing a program jump in address terms within the external test program instead of executing the respective succeeding program command of the external test program.

2. The integrated circuit according to claim 1, wherein said self-test device is a dynamic memory circuit having memory cells and program commands, said interrupt signal triggers a program jump to said program commands and execution of said program commands causes said self-test device to carry out a refresh of said memory cells.

3. The integrated circuit according to claim 1, including a time measuring device for generating said interrupt signal.

4. The integrated circuit according to claim 1, including a second external terminal for supplying said interrupt signal, said interrupt signal originating from outside the integrated circuit.

5. A method of producing a self-testing integrated circuit, the method which comprises:

providing a self-test device, a program memory and an external terminal;

connecting the self-test device to the program memory;

connecting the program memory to the external terminal;

loading external test programs having program commands into the program memory through the external terminal;

running the external test program and executing the program commands to carry out a self-test of the integrated circuit, the program commands succeeding one another in address terms;

generating an interrupt signal and inputting the interrupt signal into the self-test device; and interrupting execution of the external test program being executed by the self-test device by executing a program jump in address terms within the external test program instead of executing the respective succeeding program command of the external test program, the program jump being triggered by the interrupt signal.

6. The method according to claim 5, which comprises subsequently executing the respective succeeding program command of the external test program after the program commands to carry out a self-test of the integrated circuit are complete.

7. The method according to claim 5, which comprises providing a dynamic memory circuit having memory cells, the step of executing the program commands comprising triggering a program jump to program commands that execute a refresh of the memory cells.

8. The method according to claim 5, wherein the step of generating the interrupt signal comprises generating the interrupt signal by a time measuring device.

9. The method according to claim 5, which comprises providing a further external terminal and feeding the interrupt signal from outside the integrated circuit through the further external terminal.

* * * * *